United States Patent [19]

Lew

[11] Patent Number: 4,494,529
[45] Date of Patent: Jan. 22, 1985

[54] SOLAR TRAP

[76] Inventor: Hyok S. Lew, 7890 Oak St., Arvada, Colo. 80005

[21] Appl. No.: 335,805

[22] Filed: Dec. 30, 1981

Related U.S. Application Data

[60] Division of Ser. No. 095,535, Nov. 19, 1979, , which is a continuation-in-part of Ser. No. 574,529, May 5, 1975, abandoned.

[51] Int. Cl.$^3$ .............................................. F24J 3/02
[52] U.S. Cl. .................................... 126/439; 126/441; 126/443
[58] Field of Search ............... 126/439, 441, 443, 438; 350/299, 293, 296

[56] References Cited

U.S. PATENT DOCUMENTS

| | | | |
|---|---|---|---|
| 1,575,309 | 3/1926 | Anderson | 126/443 |
| 1,661,473 | 3/1928 | Goddard et al. | 350/296 X |
| 2,703,921 | 3/1955 | Brown, Jr. | 165/179 X |
| 3,869,199 | 3/1975 | Cummings | 350/293 |
| 3,964,464 | 6/1976 | Hockman | 126/439 X |
| 4,026,273 | 5/1977 | Parker | 126/441 X |

*Primary Examiner*—Carroll B. Dority, Jr.
*Assistant Examiner*—Allen J. Flanigan

[57] ABSTRACT

A device called Solar Trap for concentrating and collecting the solar energy is disclosed. Said Solar Trap employs, firstly, the principle of the light funneling as means for concentrating the sun light and secondly, the principle of the repeated incidence as means for enhancing the absorption of the concentrated sun light. The principle of the light funneling is realized by means of one or more of light funnels comprising a pair of reflecting surfaces arranged in V or U shaped cross sections wherein the funnel angle is greater than six degrees and the funnel opening is wider than three inches. The principle of repeated incidence is realized by means of a heat absorbing fin disposed at the apex zone of the light funnel wherein the funnel angle is equidivided to two equal halves by said heat absorbing fin, which fin transfers the heat to the heating medium circulated through a heating vessel attached to said heat absorbing fin or converts the sun light directly to the electrical energy as in the case of the heat absorbing fin made of the photovoltaic cells.

4 Claims, 12 Drawing Figures

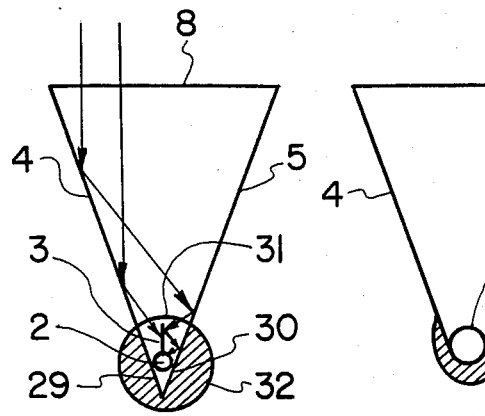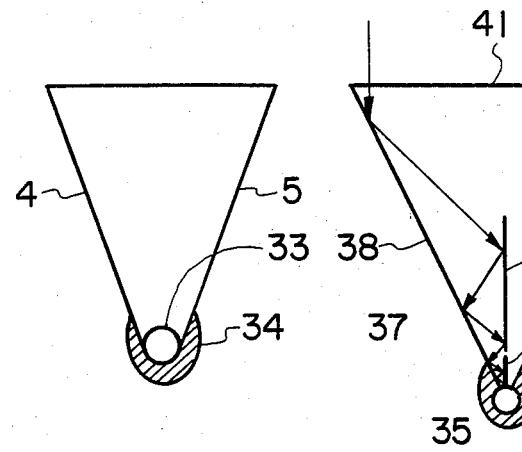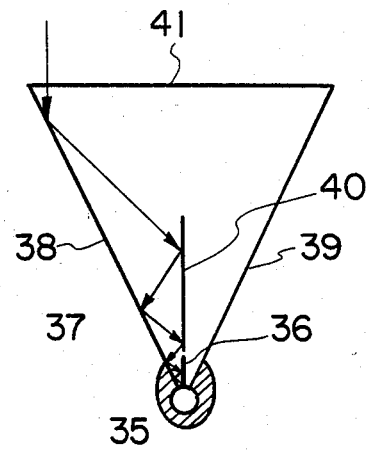
Fig. 5   Fig. 6   Fig. 7
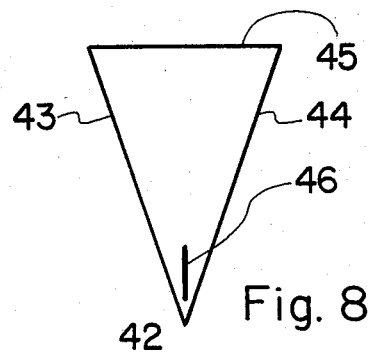
Fig. 8
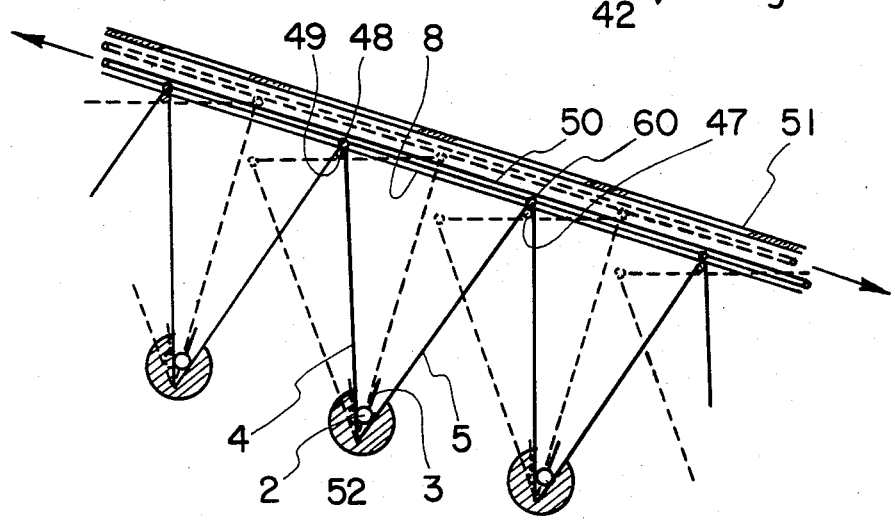
Fig. 9

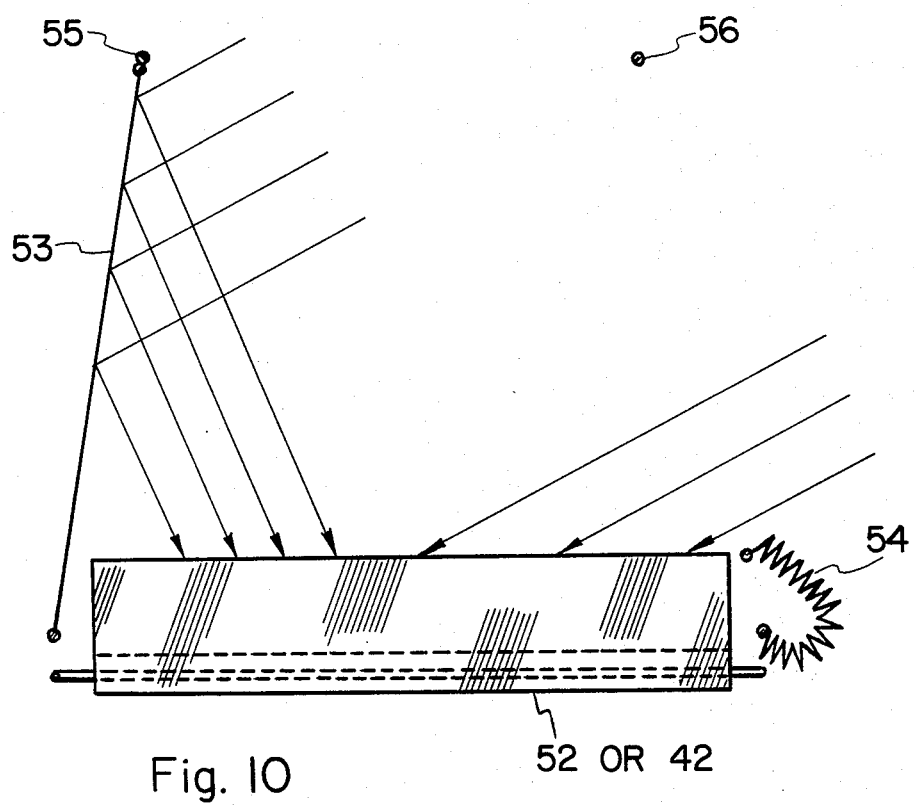
Fig. 10
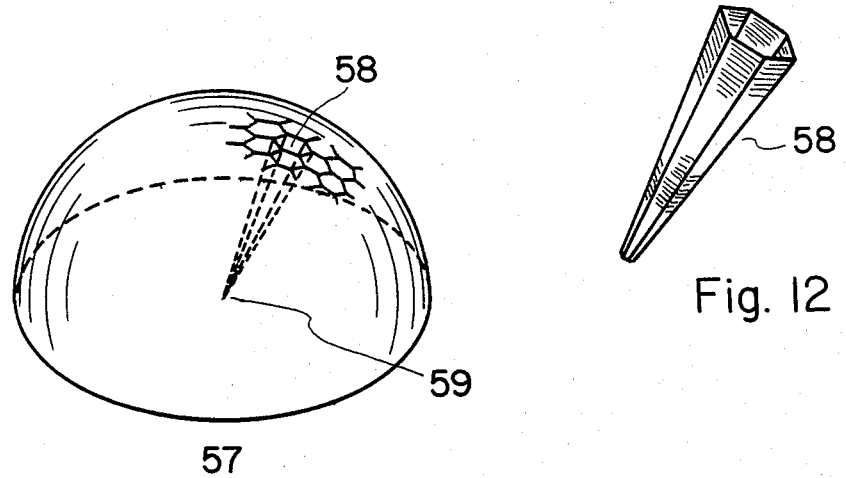
Fig. 11
Fig. 12

SOLAR TRAP

This patent application is a divisional application of patent application Ser. No. 095,535 which is a continuation-in-part of patent application Ser. No. 574,529 entitled SOLAR TRAP filed on May 5, 1975, now abandoned.

In said initial application, the solar trap employing one or more of the light funnels of all possible funnel angles and a heat absorbing fin disposed in the apex zone of the light funnel equidividing the funnel angle was claimed. In this divisional application, the funnel angle is limitted to a range greater than six degrees and less than thirty five degrees, and the width of the light funnel opening is limitted to values greater than three inches.

All of the known energy resources on the earth are bound to run out in a forseeable future. The discovery and taming of new energy resource must be accomplished before the known energy resources run out in order to insure the survival of the humen race as well as to preserve the humen civilization. In this solar system, there is only one source of the energy, the sun. All type of energy being used today originated from the sun millions of years ago and was deposited within the earth. At a time when the most important form of this deposited solar energy is rapidly dwindling, it is most logical to attempt the direct use of the solar energy as it is irradiated on the earth. The solar energy is the most clean, most abundant and most readily available energy resource. One disadvantage in the use of the solar energy is the low intensity of the sun light. It is a common understanding that an energy source must exist in a high intensity form to be useful. The harnessing of the solar energy at its natural level of intensity by such a means as the flat collector results in the extremely high cost of installation and limited application. Indeed, the full scale use of the solar energy will be technically and economically feasible only after a simple method of concentrating and collecting the solar energy is discovered or invented.

The primary object of the present invention is to provide a means for concentrating and collecting the solar energy efficiently and economically.

Another object of the present invention is to provide a solar energy concentrator-collector which does not need to track the sun's movement.

A further object of the present invention is to provide a light weight solar energy concentrator-collector which does not require the lenses or reflecting surfaces of any geometric finesse.

Yet another object of the present invention is to provide a solar energy concentrator-collector that functions efficiently without requiring a precise tracking movement to follow the sun's movement.

A still further object of the present invention is to provide a solar energy concentrator-collector which can be constructed as a foldable or inflatable structure for portability.

These and other objects of the present invention will become apparent to those skilled in the art as the description thereof proceeds. The present invention may be described with greater specificity and clarity with reference to the following figures, in which;

FIGS. 5 and 6 illustrate the cross sections of two light funnels made of a pair of flat reflecting surfaces, respectively, which light funnel can be used to construct those solar traps shown in FIGS. 1, 2 and 3.

FIG. 7 illustrates the cross section of a light funnel employing an intermediate dual-sided reflecting surface disposed intermediate the pair of reflecting surfaces of the light funnel.

FIG. 8 illustrates the cross section of a light funnel concentrating and directing the sun light to a heat absorbing fin made of photo-voltaic cells.

FIG. 9 illustrates an arrangement of a plurality of light funnels in parallel, which light funnels can be rotated individually about their apex line to track the sun's seasonal or daily movement.

FIG. 10 illustrates an arrangement of the solar trap such as those shown in FIGS. 1, 2 and 3, which operates in conjunction with a pair of reflecting curtains that reflects the sun light to the solar trap in the early morning and late afternoon.

FIG. 11 illustrates a perspective view of a hemispherical assembly of a plurality of light funnels of hollow hexagonal cone geometry.

FIG. 12 illustrates a perspective view of one of the plurality of light funnels of hollow hexagonal cone geometry shown in FIG. 11.

Before proceeding to explain the present invention as illustrated in those figures previously mentioned, the difference between the method of light funneling and the method of light focusing used in concentrating the sun light should be pointed out. In the method of light focusing, the sun light is directed to a focal point or focal line or focal zone after only single reflection from the reflecting surface. In the method of light funneling, the major portion of the sun light entering the light funnel undergoes two or more reflections from the reflecting surfaces of the light funnel before it reaches the apex zone of the light funnel. Of course, the sun light entering the light funnel through the middle of the funnel opening reaches the apex zone with a single reflection or without any reflection.

Figures 1, 2:
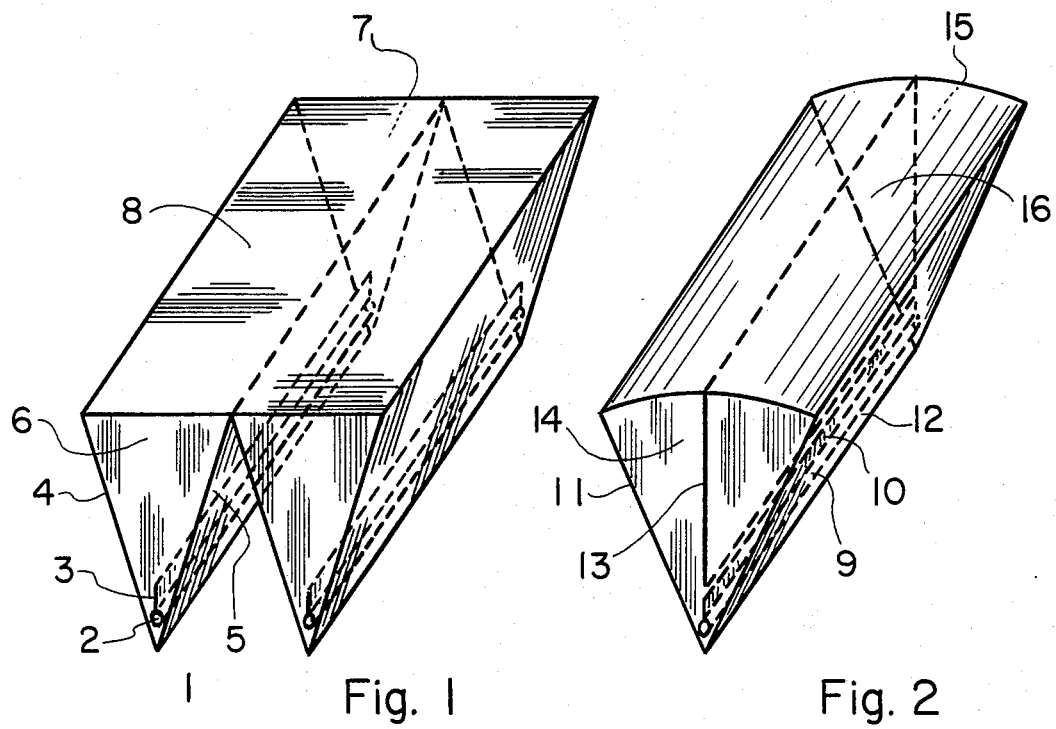
FIG. 1 illustrates a perspective view of an embodiment of the present invention teaching the principles of light funneling and enhanced absorption.
FIG. 2 illustrates a perspective view of another embodiment of the present invention.

Referring to FIG. 1, there is shown a solar trap 1 constructed in accordance with the principles of the present invention, which solar trap 1 includes one or more of the light funnels comprising a heating vessel 2 disposed in the apex zone parallel to the apex line and carrying a heating fluid, a heat absorbing fin 3 extending from the heating vessel 2 and dividing the funnel angle, a pair of reflecting surfaces 4 and 5 forming a two dimensional funnel of a V-shaped cross section, a pair of the end covers 6 and 7 which may be transparent or reflecting, and a transparent top cover 8. In order to enhance the absorption of the sun light concentrated and directed to the apex zone of the light funnel, the surface of the heat absorbing fin 3 and the heating vessel 2 should be black surfaces or of other color and texture appropriate for better absorption under specific circumstances. The heating vessel 2 and the heat absorbing fin 3 can be integrated into a single element by employing a flat heating vessel disposed in the same position as the heat absorbing fin 3. The light funnel should face directly to the sun wherein the sun light enters the light funnel generally parallel to the heat absorbing fin 3.

Figures 3, 4:
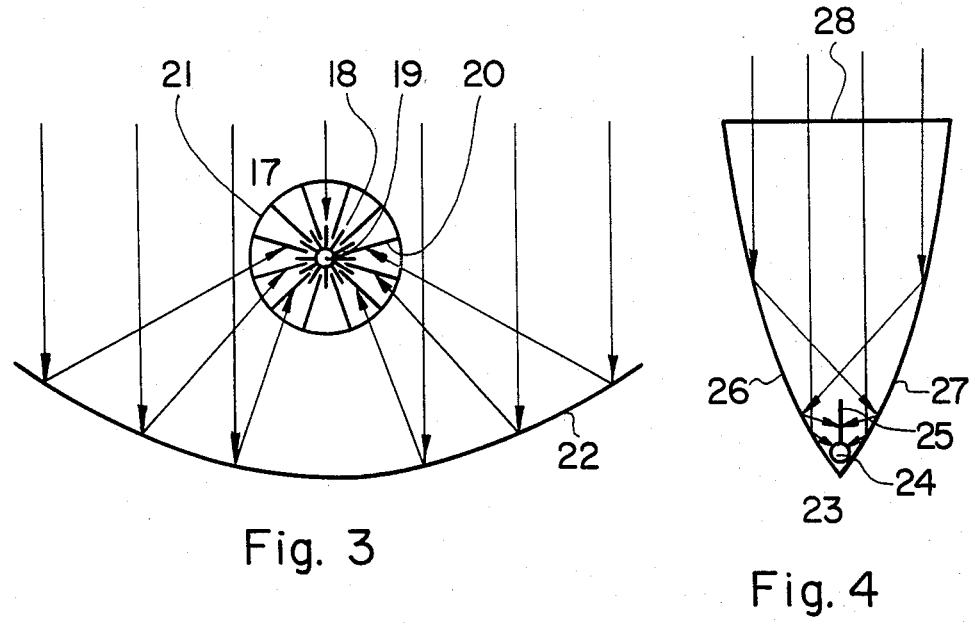
FIG. 3 illustrates a cross section view of a further embodiment of the present invention wherein the principle of light funneling and enhanced absorption taught by the present invention is used in conjunction with a light focusing method.
FIG. 4 illustrates the cross section of a light funnel made of a pair of slightly curved reflecting surfaces and a heating vessel with a heat absorbing fin, which light funnel can be employed in constructing those solar traps shown in FIGS. 1, 2 and 3.

The sun light entering the top opening of the light funnel through the transparent cover 8 is funneled to the apex zone as the sun light is reflected back and forth between the pair of reflecting surfaces 4 and 5, which funneling principle is geometrically illustrated in FIGS. 4 and 5. The degree of the concentration of the sun light at various points between the funnel top opening and the funnel apex is proportional to the ratio of the width of the funnel top opening divided by the width between the pair of the reflecting surfaces 4 and 5 at the point under consideration. If the reflectivity of the pair of the reflecting surfaces 4 and 5 is one hundred percent, the intensity of the sun light increases at the same rate as the previously mentioned ratio of the funnel width as the sun light is funneled toward to the apex zone of the light funnel. As the sun light is funneled and concentrated, the sun light directed to the heat absorbing fin irradiates the heat absorbing fin with a greater intensity. Any portion of the sun light irradiating the surface of the heat absorbing fin that is not absorbed on its first impingement upon the heat absorbing fin is reflected to the adjacent reflecting surface and is reflected right back to the surface of the heat absorbing fin, which process repeats continuously until almost one hundred percent of the sun light funneled to the apex zone is absorbed by the the heat absorbing fin. It is not difficult to realize that the space enclosed within the light funnel is further heated by the green house effect and, consequently, reduces the convective heat loss from the heating vessel. The beauty of the solar trap is that the solar trap has built in means for concentrating, absorbing and insulating.

In FIG. 2 there is shown another solar trap constructed in accordance with the principle of the present invention, which solar trap includes one or more of the light funnels having a common apex line, a heating vessel 9 with a heat absorbing fin 10 extending therefrom, wherein said heat absorbing fin absorbs the concentrated sun light funneled by a pair of reflecting surfaces 10 and 22. A dual-sided reflecting surface 13 is disposed intermediate the pair of reflecting surfaces 11 and 12 wherein the top end of said plate is terminated at a height which is just high enough to catch the sun light reflected by the upper extremity of the pair of the reflecting surfaces 11 and 12 while the bottom end of said plate is terminated to provide a room for the heat absorbing fin 10 dividing the funnel angle. Both ends of the solar trap are sealed by a pair of end covers 14 and 15, which may be either reflecting or transparent. The top opening of the solar trap is covered with a transparent cover 16 which may be a curved or flat surface. The heat absorbing fin can be arranged in many different ways. For example, the apex end of the pair of the reflecting surfaces forming the light funnel can be terminated and replaced with a pair of the heat absorbing fins extending from the heating vessel.

Reffering to FIG. 3, there is shown the cross section of a solar trap 17 operating in conjunction with a curved reflecting surface 22 which reflects the incoming light and focuses to a focal zone where the solar trap 17 is placed. This combination of the solar trap 17 and the curved reflecting surface 22 provides the following advantage: The curved reflecting surface 22 does not require a perfect parabolic geometry and does not need to track the sun's movement precisely because the solar trap 17 takes care of the final concentration as long as the curved reflecting surface 22 focuses the sun light to the general region where the solar trap 17 is located. The solar trap 17 not only further concentrates the preliminarily focused sun lights but also enhances the absorption of the concentrated sun light as well as providing an insulating effect which reduces the heat loss from the heating vessel to the atmosphere. In general, the inside space of the solar trap 17 shoud be evacuated to prevent the heat loss from the heating vessel, which vacuum can be obtained by using a rigid transparent tubing 21 wherein the air inside is evacuated. A plurality of dual-sided reflecting surfaces 20 are disposed axisymmetrically about the heating vessel 19 in a radiating pattern. A plurality of heat absorbing fins 19 extending radially from the heating vessel 19 are disposed intermediate each pair of two adjacent dual-sided reflecting surfaces 20.

The solar traps shown in FIGS. 1, 2 and 3 may be disposed in a position wherein the apex line of the solar funnel is placed parallel to the east-west direction. The solar trap in such a placement and lined up to receive the sun light straight into the solar funnels concentrates and collects the solar energy all day without tracking the sun's movement. Of course, the lining up of such a solar trap toward to the sun has to be adjusted seasonally. Those solar traps shown in FIGS. 1, 2 and 3 may also be placed in a position wherein the the apex line of the solar funnel is lined up to the north-south direction. The solar trap placed in such a position must have means for rotating the solar/funnels about their apex lines, which means enables them to track the sun's movemovement.

In FIG. 4, there is shown the cross section of a light funnel 23 including a heating vessel 24 with a heat absorbing fin 25 extending therefrom, a light funnel comprising a pair of curved reflecting surfaces 26 and 27 arranged in a U-shaped cross section, and a transparent top cover 28. The funnel angle of the light funnel of a U-shaped cross section is defined as the angle between two hypothetical planes respectively connecting the top end of each of the reflecting surfaces 26 and 27 to the apex line of the light funnel.

Reffering to FIG. 5, there is shown the cross section of a light funnel having a V-shaped cross section, which light funnel comprises a heating vessel 2 with a heat absorbing fin 3 extending therefrom, a pair of flat reflecting surfaces 4 and 5 arranged into a V-shaped cross section, and a transparent top cover 8. A transparent partition 31 separates the apex zone from the remaining space within the light funnel. The apex-end portions 29 and 30 of the reflecting surfaces 4 and 5 as well as the bottom half of the heating vessel 2 are surrounded by a insulating material 32. In order to check the heat loss from the heating vessel to its surroundings, the apex end zone enclosing the heating vessel and the heat absorbing fin, which zone is separated by the transparent partition 31, should be evacuated.

In FIG. 6, there is shown the cross section of another light funnel wherein a transparent tubing 33 is disposed in place of the heating vessel with a heat absorbing fin. In this arrangement, the pair of reflecting surfaces 4 and 5 funnels the sun light directly into the transparent tubing 33. The apex end of the light funnel as well as the bottom half of the transparent tubing 33 are insulated by a insulating material. 34. Of course, the bottom half inside surface of the transparent tubing 33 can be coated with a black surface to enhance the absorption of the sun light.

There is shown in FIG. 7 the cross section of a further light funnel 35 comprising a heating vessel 37 with a heat absorbing fin 36 disposed along the apex line, a pair of reflecting surfaces 38 and 39, a dual-sided reflecting plane 40 which divides the funnel angle equally, and a transparent top 41. The apex end of the reflecting surfaces 38 and 39 as well as the bottom half of the heating vessel 37 are insulated by a insulating material. The top end of the dual-sided reflecting plane extends only to a height high enough to reflect back the light reflected from the top ends of the reflecting surfaces 38 an 39, while the apex end is terminated before reaching the apex line in order to dipose the heat absorbing fin 36 in the middle of the funnel angle.

In FIG. 8, there is shown the cross section of a solar trap 42 concentrating and directing the sun light to a photovoltaic panel, which solar trap comprises a light funnel including a pair of reflecting surfaces 43 and 44 plus a transparent top 45, and a photovoltaic panel 46 with both sides covered with photovoltaic cells, which panel is disposed at the apex zone intermediate said pairs of the reflecting surfaces 43 and 44 dividing the funnel angle into two equal halves.

Reffering to FIG. 9, there is shown the cross section of a solar trap 52 which is particularly suited for rotating the individual solar funnels to line up with the sun light. In this arrangement, a plurality of the light funnels comprising a heating vessel 2 with a heat absorbing fin 3, a pair of reflecting surfaces 4 and 5 and a transparent top 8 are disposed in a parallel configuration wherein each of the light funnels is rotatable about its apex line. The top ends 60, 48 etc. of one reflecting surface of each solar funnel are attached to a cord 50 while the other ends 47, 49 etc. of the other reflecting surface of each solar funnel are unrestrained. An additional transparent cover 51 covers the entire top of the solar trap 52, which additional transparent cover 51 is disposed well above the transparent top of each solar funnel so that each of the solar funnels can be rotated about its apex line without touching the additional transparent top cover 51. It can be easily visualized that, by pulling the cord 50 in either direction, each of the solar funnels can be rotated from the position shown in the solid line to that shown in broken line or to any other intermediate positions and vice versa. This arrangement of the solar trap 52 is particularly useful for the seasonal adjustment of the solar trap to line it up with the sun when the solar trap is disposed parallel to the east-west direction.

In FIG. 10, there is shown the solar trap such as 52 or 42 or that shown in FIG. 3 which solar trap operates in conjunction with a pair of reflecting curtains 53 and 54. In the morning when the sun is relatively low over the east horizon, the reflecting curtain 53 is raised and tied to the support 55, while the reflecting curtain 54 is lowered. The raised reflecting curtain 53 reflects the sun light toward to the solar trap. Near the noon hours, both reflecting curtains are lowered. In the late afternoon, the reflecting curtain 54 is raised and tied to the support 56 to reflect the late afternoon sun light to the solar trap. Of course, the pair of the reflecting curtains 53 and 54 can be used as another light funnel which tracks the sun's movement and funnel the sun light to the solar trap.

A hemispherical solar trap is illustrated in FIG. 11 wherein each component light funnel 58 is made in the shape of a hollow hexagonal cone as shown in FIG. 12. Each of these component light funnels funnels and focuses the sun light to the heating vessel located at the center 59 of the base of the hemisphere. Such an assembly of hollow hexagonal cone light funnels can be used to detect the source of the radiation in the universe when each light funnel is provided with an independent detector disposed at the apex end.

While the principles of the invention have now been made clear in an illustrative embodiment, there will be immediately obvious to those skilled in the art many modifications of structure, arrangements, proportions, the elements, materials and components used in the practice of the invention which are particularly adapted for specific environments and operating requirements without departing from those principles of the invention.

I claim:

1. A device for concentrating and collecting the solar energy comprising in combination:
   (a) a sun light funneling and absorbing assembly including a transparent tubing; a plurality of flat dual-sided reflecting members disposed radially in a substantially axisymmetric pattern within said transparent tubing wherein the angle between two adjacent reflecting surfaces of said plurality of flat dual-sided reflecting members is greater than six degrees and less than thirty five degrees and the distance between the outer edges of two adjacent reflecting surfaces of said plurality of flat dual-sided reflecting members is greater than one and three quarters inches; a heating vessel disposed coaxially inside of said transparent tubing for carrying a heating fluid; and a plurality of heat absorbing fins affixed to and extending radially from said heating vessel a short distance in a substantially axisymmetric pattern wherein each of said plurality of heat absorbing fins is disposed intermediate an adjacent pair of said flat dual-sided reflecting members; whereby, the sunlight entering through said transparent tubing in a substantially radial direction with respect to said assembly is funneled toward said heating vessel by said plurality of flat dual-sided reflecting members and absorbed by said plurality of heat absorbing fins through the repeated irradiation process wherein the sunlight is reflected back and forth between one of said flat dual-sided reflecting members and one adjacent heat absorbing fin, and between two adjacent heat absorbing fins of said plurality of heat absorbing fins; and
   (b) one or more curved light reflecting surfaces disposed about said sunlight funneling and absorbing assembly wherein said one or more curved light reflecting surfaces reflects the sun light towards said sunlight funneling and absorbing assembly in a roughly focused manner.

2. The combination as set forth in claim 1 wherein the space within said transparent tubing is evacuated.

3. The combination as set forth in claim 1 wherein said heat absorbing fins are coated with a black coating.

4. The combination as set forth in claim 1 wherein the space within said transparent tubing is evacuated and said heat absorbing fins are coated with a black coating.

* * * * *